(12) United States Patent
Hammer et al.

(10) Patent No.: US 12,494,431 B2
(45) Date of Patent: Dec. 9, 2025

(54) POWER SEMICONDUCTOR DEVICE AND METHOD OF PRODUCING A POWER SEMICONDUCTOR DEVICE

(71) Applicant: Infineon Technologies AG, Neubiberg (DE)

(72) Inventors: Christian Hammer, Lappersdorf (DE); Matthias Mueller, Regensburg (DE); Wolfgang Lehnert, Lintach (DE)

(73) Assignee: Infineon Technologies AG, Neubiberg (DE)

( * ) Notice: Subject to any disclaimer, the term of this patent is extended or adjusted under 35 U.S.C. 154(b) by 736 days.

(21) Appl. No.: 17/850,178

(22) Filed: Jun. 27, 2022

(65) Prior Publication Data

US 2022/0415820 A1  Dec. 29, 2022

(30) Foreign Application Priority Data

Jun. 29, 2021  (DE) .......................... 102021116724.8

(51) Int. Cl.
*H01L 23/532* (2006.01)
*C23C 16/455* (2006.01)
*H01L 21/02* (2006.01)
*H01L 21/768* (2006.01)
*H10D 62/85* (2025.01)

(52) U.S. Cl.
CPC .. *H01L 23/53238* (2013.01); *C23C 16/45529* (2013.01); *C23C 16/4554* (2013.01); *H01L 21/0254* (2013.01); *H01L 21/76846* (2013.01); *H10D 62/8503* (2025.01)

(58) Field of Classification Search
CPC ........... H01L 23/53238; H01L 21/0254; H01L 21/76846; H01L 23/3171; H01L 21/283; C23C 16/45529; C23C 16/4554; H10D 62/8503; H10D 12/441; H10D 30/66; H10D 64/62; H10D 8/00; H10D 64/01; H10D 64/252; H10D 8/01; H10D 12/00; H10D 12/01; H10D 30/021; H10D 30/60
See application file for complete search history.

(56) References Cited

U.S. PATENT DOCUMENTS 6,303,410 B1 * 10/2001 Baliga ................. H10D 12/038
438/137
2009/0273085 A1 * 11/2009 Jourdan ............ H01L 23/53295
257/E21.584

(Continued)

FOREIGN PATENT DOCUMENTS

JP        2010034490 A     2/2010

*Primary Examiner* — Marlon T Fletcher
*Assistant Examiner* — Samuel Jonathan Smith
(74) *Attorney, Agent, or Firm* — Murphy, Bilak & Homiller, PLLC

(57) ABSTRACT

A power semiconductor device includes a semiconductor body; a first load terminal at the semiconductor body; and a second load terminal at the semiconductor body. The power semiconductor device is configured to conduct a load current between the first load terminal and the second load terminal. The first load terminal has a first side and a second side adjoining the semiconductor body. The first load terminal includes: at the first side, an atomic layer deposition (ALD) layer; at the second side, a base layer including copper; and between the ALD layer and the base layer, a coupling layer that includes copper-silicon-nitride (CuSiN).

36 Claims, 2 Drawing Sheets

(56) References Cited

U.S. PATENT DOCUMENTS

| | | | | |
|---|---|---|---|---|
| 2011/0101521 A1* | 5/2011 | Hwang | ................... | H01L 24/11 |
| | | | | 257/737 |
| 2012/0319279 A1* | 12/2012 | Isobayashi | ........ | H01L 23/53238 |
| | | | | 438/653 |
| 2018/0205014 A1* | 7/2018 | Lv | ........................ | H10N 70/245 |
| 2020/0185297 A1* | 6/2020 | Konrath | ............... | H10D 12/441 |

* cited by examiner

POWER SEMICONDUCTOR DEVICE AND METHOD OF PRODUCING A POWER SEMICONDUCTOR DEVICE

TECHNICAL FIELD

This specification refers to embodiments of a power semiconductor device and to embodiments of a method of producing a power semiconductor device.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate or control electrode. For example, upon receiving a corresponding control signal from, e.g., a driver unit, the control electrode may set the power semiconductor device in one of a forward conducting state and a blocking state. In some cases, the gate electrode may be included within a trench of the power semiconductor switch, wherein the trench may exhibit, e.g., a stripe configuration or a needle configuration.

Some power semiconductor devices further provide for a reverse conductivity; during a reverse conducting state, the power semiconductor device conducts a reverse load current. Such devices may be designed such that the forward load current capability (in terms of magnitude) is substantially the same as the reverse load current capability. A typical device that provides for both forward and reverse load current capability is the reverse conducting (RC) IGBT.

After the wafer has been processed and the chips have been diced out, the chips may be installed in a package to form a power semiconductor device module. Within the module, the load terminals and the control terminals must be electrically contacted. To ensure insulation between the load and control terminals and to provide for an environmental sealing, the chips are typically covered with an encapsulation, e.g., comprising imide, within the package.

The present specification is directed to the coupling between the terminal(s) and the encapsulation. It is a design goal of the present application to ensure a reliable and safe coupling between the terminal(s) and the encapsulation.

SUMMARY

According to an embodiment, a power semiconductor device comprises a semiconductor body; a first load terminal and a second load terminal, both at the semiconductor body, wherein the power semiconductor device is configured for conducting a load current between the first load terminal and the second load terminal. The first load terminal has a first side and a second side adjoining the semiconductor body. The first load terminal comprises: at the first side, an atomic layer deposition, ALD, layer; at the second side, a base layer comprising copper; and between the ALD layer and the base layer, a coupling layer, wherein the coupling layer comprises copper-silicon-nitride, CuSiN.

According to an embodiment, a power semiconductor device comprises a semiconductor body; a first load terminal and a second load terminal, both at the semiconductor body, wherein the power semiconductor device is configured for conducting a load current between the first load terminal and the second load terminal. The first load terminal has a first side and a second side adjoining the semiconductor body. The first load terminal comprises: at the first side, an atomic layer deposition, ALD, layer; at the second side, a base layer comprising copper; and between the ALD layer and the base layer, a coupling layer, wherein the coupling layer comprises copper-germanium-nitride, CuGeN.

According to an embodiment, a power semiconductor device comprises a semiconductor body; a control terminal, a first load terminal and a second load terminal, each at the semiconductor body, wherein the power semiconductor device is configured for conducting a load current between the first load terminal and the second load terminal. The control terminal has a first side and a second side adjoining a control electrode. The control terminal comprises: at the first side, an atomic layer deposition, ALD, layer; at the second side, a base layer comprising copper; and between the ALD layer and the base layer, a coupling layer, wherein the coupling layer comprises one of copper-silicon-nitride, CuSiN, and copper-germanium-nitride, CuGeN.

According to an embodiment, a method of producing a power semiconductor device comprises forming: a semiconductor body; a first load terminal and a second load terminal, both at the semiconductor body, wherein the power semiconductor device is configured for conducting a load current between the first load terminal and the second load terminal. The first load terminal has a first side and a second side adjoining the semiconductor body. The first load terminal comprises: at the first side, an atomic layer deposition, ALD, layer; at the second side, a base layer comprising copper; and between the ALD layer and the base layer, a coupling layer, wherein the coupling layer comprises copper-silicon-nitride, CuSiN.

According to an embodiment, a method of producing a power semiconductor device comprises forming: a semiconductor body; a first load terminal and a second load terminal, both at the semiconductor body, wherein the power semiconductor device is configured for conducting a load current between the first load terminal and the second load terminal. The first load terminal has a first side and a second side adjoining the semiconductor body. The first load terminal comprises: at the first side, an atomic layer deposition, ALD, layer; at the second side, a base layer comprising copper; and between the ALD layer and the base layer, a coupling layer, wherein the coupling layer comprises copper-germanium-nitride, CuGeN.

According to an embodiment, a method of producing a power semiconductor device comprises forming: a semiconductor body; a control terminal, a first load terminal and a second load terminal, each at the semiconductor body, wherein the power semiconductor device is configured for conducting a load current between the first load terminal and the second load terminal. The control terminal has a first side and a second side adjoining a control electrode. The control terminal comprises: at the first side, an atomic layer deposition, ALD, layer; at the second side, a base layer comprising copper; and between the ALD layer and the base layer, a coupling layer, wherein the coupling layer comprises one of copper-silicon-nitride, CuSiN, and copper-germanium-nitride, CuGeN.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1:
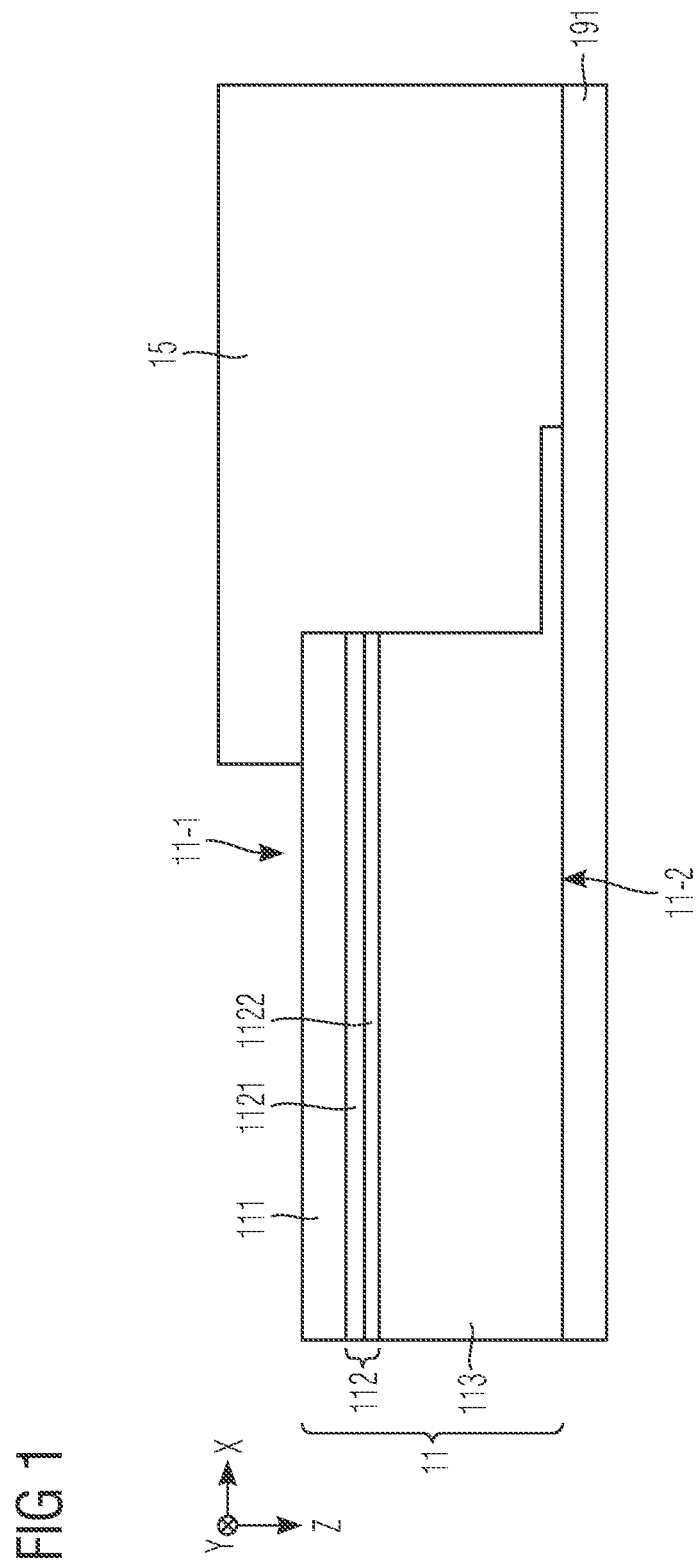
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned herein can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the vertical direction Z mentioned herein may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other does not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to a power semiconductor device, such as an IGBT, an RC IGBT, a MOSFET, a diode or derivatives thereof, e.g., a power semiconductor device to be used within a power converter or a power supply. Thus, in an embodiment, such power semiconductor device can be configured to carry a load current that is to be fed to a load and/or, respectively, that is provided by a power source. For example, the power semiconductor device may comprise a plurality of power semiconductor cells, such as monolithically integrated diode cells, derivatives of a monolithically integrated diode cell, monolithically integrated MOSFET or IGBT cells and/or derivatives thereof. Such diode/transistor cells may be integrated in a power semiconductor module. A plurality of such cells may constitute a cell field that is arranged within an active region of the power semiconductor device.

The term "power semiconductor device" as used in this specification intends to describe a power semiconductor device on a single chip with high voltage blocking and/or high current-carrying capabilities. In other words, embodiments of the power semiconductor device described herein are single chip power semiconductor devices configured for high current, typically in the Ampere range, e.g., up to several Ampere or up to several ten or hundred Ampere, and/or high voltages, typically 200 V and above, e.g., up to at least 400 V or even more, e.g., up to at least 3 kV, or even up to 10 kV or more.

For example, the power semiconductor device described below may be a single chip power semiconductor device configured to be employed as a power component in a low-, medium- and/or high voltage application. Several single chip power semiconductor device may be integrated in a module so as to form a power semiconductor device module, e.g., for installation and use in a low-, medium- and/or high voltage application, such as a major home appliance, a general purpose drive, an electric-drive train, a servo drive, a traction, a (higher) power transmission facilities, etc.

For example, the term "power semiconductor device" as used in this specification is not directed to a logic semiconductor device used for, e.g., storing data, computing data and/or other types of semiconductor based data processing.

Figure 2:
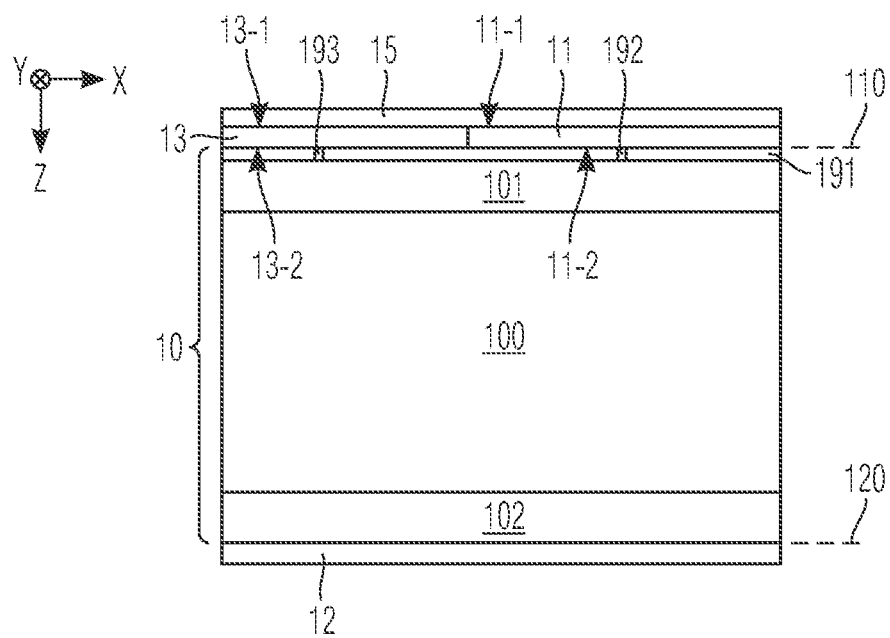
FIG. 2 schematically and exemplarily illustrates a section of a vertical cross-section of a power semiconductor device in accordance with one or more embodiments.
Figure 3:
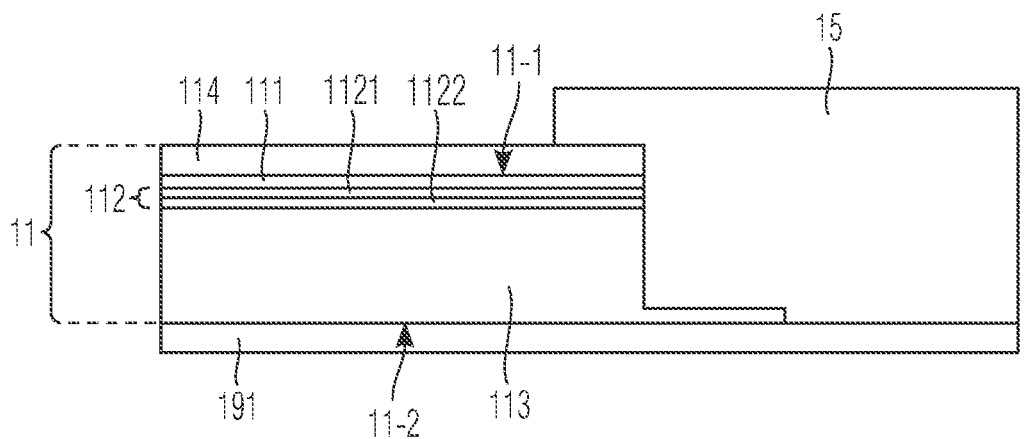
FIG. 3 schematically and exemplarily illustrates a section of a vertical cross-section of a power semiconductor device in accordance with one or more embodiments.

FIGS. 1 to 3 each schematically and exemplarily illustrates a section of a vertical cross-section of a power semiconductor device 1 in accordance with one or more embodiments.

Referring to FIG. 2 first, the power semiconductor device 1 has a semiconductor body 10 and, coupled thereto, a first load terminal 11 and a second load terminal 12. The power semiconductor device 1 is configured for conducting a load current between the first load terminal 11 and the second load terminal 12. The first load terminal 11 may be arranged at a first side 110 of the semiconductor body 10, wherein the first side 110 may be a frontside. The second load terminal 12 may also be arranged at a first side 110 of the semiconductor body 10, or, alternatively, as illustrated, at a second side 120 of the semiconductor body 10, wherein the second side 120 may be a backside.

For example, when being installed in a package (not illustrated), the power semiconductor device 1 is mounted such that its backside 120 rests on a floor of the package, whereas the frontside 110 and the first load terminal 11 face to the interior of the package. As described in the introduction, the first load terminal 11 (and, if present, further terminals) at the frontside 110 are at least partly covered with an encapsulation 15 to ensure terminal insulation and environmental sealing. For example, the first load terminal 11 (and, if present, further terminals) may be partly or fully covered with the encapsulation 15. For example, a first side 11-1 of the first load terminal 11 adjoins the encapsulation 15, and a second side 11-2 of the first load terminal 11 adjoins the semiconductor body 10, e.g., via a contact plug 192.

The semiconductor body 10 can exhibit any configuration, such as a diode configuration, a MOSFET configuration, an IGBT configuration or a derivate thereof. According to the configuration, the semiconductor body 10 may comprise several doped regions. These configurations are principally known to the skilled person and will hence not described here in more detail. On a general level, the semiconductor body 10 may comprise a first doped region 101 at the first side 110 and a second doped region 102 at the second side 120. Typically, the major portion of the semiconductor body 10 is formed by a drift region 100. For example, in case of a diode, the first doped region 101 is an anode region of the second conductivity type, the drift region 100 is of the first conductivity type, and the second doped region 102 is a field stop region also of the first conductivity type, but exhibiting a greater dopant concentration as compared to the drift region 100.

In case of a controllable device, the power semiconductor device 1 further comprises a control terminal 13, typically also arranged at the frontside 110, but separated and insulated from the first load terminal. For example, a first side 13-1 of the control terminal 13 adjoins the encapsulation 15, and a second side 13-2 of the first load terminal 13 adjoins a control electrode (not illustrated), e.g., via a further contact plug 193.

The first load terminal 11 (and, if present, the control terminal 13) may be separated from the semiconductor body based on an insulation layer 191. Said contact plugs 192, 193 may penetrate the insulation layer 191.

Now referring to FIG. 1 in more detail, the first load terminal 11 comprises, at the first side 11-1, an ALD layer 111. For example, the ALD layer 111 forms the first side 11-1. At the second side, 11-2, the first load terminal 11 comprises a base layer 113. The base layer 113 comprises copper or, respectively, is made of copper. The base layer 113 may form the second side 11-2 that adjoins the semiconductor body 10, e.g., in a manner as described with respect to FIG. 2. Between the ALD layer 111 and the base layer 113, the first load terminal comprises a coupling layer 112, As used herein, the term "ALD layer" refers to a layer that has a film-like structure. For example, the ALD layer 111 has been grown by exposing the surface of the coupling layer 112 to alternate gaseous species (typically referred to as precursor or reactants). For example, the precursors are not present simultaneously in the reactor, but they are inserted as a series of sequential, non-overlapping pulses. In each of these pulses, the precursor molecules react with the surface in a self-limiting way, so that the reaction terminates once all the reactive sites on the surface are consumed.

An ALD layer can be characterized by its high uniformity. For example, differently oriented or concave surfaces may comprise a very consistent coating, when the coating is an ALD layer. Therefore, the reliability of the device may be further increased with the layer 111 being an ALD layer when compared to other coating techniques. However, the present power semiconductor device is not limited to ALD coatings. In some embodiments, the layer 111 may not be configured as an ALD layer but as a layer made with a different coating technique.

In an embodiment, the coupling layer 112 comprises copper-silicon-nitride, CuSiN. For example, the coupling layer 112 has a CuSiN sublayer 1121 in contact with the ALD layer 111. Further, the coupling layer 112 can have a CuSi sublayer 1122 in contact with the base layer 113.

In another embodiment, the coupling layer 112 comprises copper-germanium-nitride, CuGeN. For example, the coupling layer 112 in this case can have a CuGeN sublayer 1121 in contact with the ALD layer 111. Further, the coupling layer 112 can then have a CuGe sublayer 1122 in contact with the base layer 113.

The coupling layer 112 may be configured to act as an adhesion promoter between the base layer 113 and the ALD layer 111.

As described above, the first side 11-1 of the first load terminal 11 adjoins the encapsulation 15. For example, the ALD layer 111 is coupled to or, respectively, arranged in contact with the encapsulation 15. The ALD layer 111 may be in direct contact with encapsulation 15, as illustrated in FIG. 1, or, as illustrated in FIG. 3, a further coupling layer 114 may be arranged between the ALD layer 11 and the encapsulation 15. For example, the further coupling layer is a SiN layer (e.g., in case the coupling layer 112 comprises CuSiN) or, the further coupling layer is a GeN layer (e.g., in case the coupling layer 112 comprises CuGeN).

The encapsulation 15 is at least partly made of an insulating material, e.g., an imide or another polymer-based dielectric, BCB (benzocyclobutan), or at least one out of the group of silicones. Examples for the polymer-based dielectric are epoxy (WPR), polyimide, and PBO. The encapsulation 15 may cover the first load terminal 11, and wherein each transition between the first load terminal 11 and the encapsulation 15 includes a layer stack comprising each of a portion of the base layer 113, a portion of the coupling layer 112 and a portion of the ALD layer 111. Accordingly, in contrast to the schematic representations in FIGS. 1 and 3, the layer stack along the vertical direction Z formed by the encapsulation 15, the ALD layer 111, the coupling layer 112 and the base layer 113 may also be implemented along the first lateral direction X.

In an embodiment, the ALD layer 111 has a thickness (in FIGS. 1 and 3, along the vertical direction Z) within the range of 2 nm to 20 nm, e.g., within the range of 5 nm to 10 nm. The ALD layer may further comprise a metal oxide, for example one or more of aluminum oxide ($AlO_x$, $Al_xO_y$, e.g., $Al_2O_3$), hafnium oxide ($HfO_x$), zirconium oxide ($ZrO_x$), titanium oxide ($TiO_x$). In another embodiment, the ALD layer 111 comprises a semiconductor oxide, such as silicon oxide ($SiO_x$).

Further, the coupling layer 112 can have a thickness (in FIGS. 1 and 3, along the vertical direction Z) within the range of 1 nm to 15 nm, e.g., within the range of 2 nm to 10 nm, e.g., within the range of 2 nm to 3 nm.

The sublayer 1121 (which is, e.g., the CuSiN sublayer or the CuGeN sublayer) can have a thickness (in FIGS. 1 and 3, along the vertical direction Z) within the range of 1 nm to 5 nm.

The portion of the semiconductor material (e.g., silicon or germanium) in the sublayer 1121 may amount to a total of at least 20% of the sublayer 1121.

As described above, the base layer 113 comprises copper. The base layer 113 may be made of copper or, respectively, consist of a material having a copper portion of at least 80%. Compared to the other layers 111 and 112, base layer 113 is thicker. For example, the base layer 113 has a thickness (in FIGS. 1 and 3, along the vertical direction Z) of at least 2 µm.

Presented herein are also methods of producing a power semiconductor device.

According to one embodiment, a method of producing a power semiconductor device comprises forming: a semiconductor body; a first load terminal and a second load terminal, both at the semiconductor body, wherein the power semiconductor device is configured for conducting a load current between the first load terminal and the second load terminal. The first load terminal has a first side and a second side adjoining the semiconductor body. The first load terminal comprises: at the first side, an atomic layer deposition, ALD, layer; at the second side, a base layer comprising copper; and between the ALD layer and the base layer, a coupling layer, wherein the coupling layer comprises copper-silicon-nitride, CuSiN.

According to another embodiment, a method of producing a power semiconductor device comprises forming: a semiconductor body; a first load terminal and a second load terminal, both at the semiconductor body, wherein the power semiconductor device is configured for conducting a load current between the first load terminal and the second load terminal. The first load terminal has a first side and a second side adjoining the semiconductor body. The first load terminal comprises: at the first side, an atomic layer deposition, ALD, layer; at the second side, a base layer comprising copper; and between the ALD layer and the base layer, a coupling layer, wherein the coupling layer comprises copper-germanium-nitride, CuGeN.

According to an embodiment, a method of producing a power semiconductor device comprises forming: a semiconductor body; a control terminal, a first load terminal and a second load terminal, each at the semiconductor body, wherein the power semiconductor device is configured for conducting a load current between the first load terminal and the second load terminal. The control terminal has a first side and a second side adjoining a control electrode. The control terminal comprises: at the first side, an atomic layer deposition, ALD, layer; at the second side, a base layer comprising copper; and between the ALD layer and the base layer, a coupling layer, wherein the coupling layer comprises one of copper-silicon-nitride, CuSiN, and copper-germanium-nitride, CuGeN.

Embodiments of the power semiconductor device production methods correspond to the embodiments of the power semiconductor device 1 presented above.

For example, forming the base layer 113 includes at least one of an electro-plating processing step and a deposition processing step.

Further, forming the coupling layer 112 includes depositing silicon, Si, or, respectively, germanium, Ge, onto a surface of the base layer 113. As described above, instead of Si or Ge, another semiconductor material may be used. For example, a plasma enhanced chemical vapor deposition, PE-CVD, may be applied to this end. Also the further coupling layer 114 may be formed based on a PE-CVD processing step.

Forming the coupling layer 112 may further includes an ammonia, NH3, plasma treatment processing step. Thereby, the amount of copper oxide can be reduced and, e.g., after a silane, SiH4, flow processing step and a further NH3 plasma treatment processing step, the CuSi-Nitridation can be achieved. An optical application may be used to monitor process stability.

In the above, embodiments pertaining to a power semiconductor device and corresponding production methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed. For example, the above described values of the dopant concentrations and dopant doses are related to embodiments where Si is chosen as the material of the semiconductor body 10.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), aluminum gallium nitride (AlGaN) and aluminum indium nitride (AlInN). For power semiconductor switches applications currently mainly Si, SiC, GaAs and GaN materials are used.

For example, for embodiments where SiC is chosen as the material of the semiconductor body 10, the above described values of the dopant concentrations and dopant doses may need to be adapted. For example, in case of SiC, the dopant concentrations are increased by a factor of ten or a factor of 100, and the dopant doses are increased by a factor between three and ten, compared to the values of the doses and concentrations described above.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a semiconductor body;
    a first load terminal at the semiconductor body; and
    a second load terminal at the semiconductor body,
    wherein the power semiconductor device is configured to conduct a load current between the first load terminal and the second load terminal,
    wherein the first load terminal has a first side and a second side adjoining the semiconductor body,
    wherein the first load terminal comprises:
        at the first side, an atomic layer deposition (ALD) layer;
        at the second side, a base layer comprising copper; and
        between the ALD layer and the base layer, a coupling layer that comprises copper-silicon-nitride (CuSiN).

2. The power semiconductor device of claim 1, wherein the coupling layer comprises a CuSiN sublayer in contact with the ALD layer.

3. The power semiconductor device of claim 2, wherein the CuSiN sublayer has a thickness within a range of 1 nm to 5 nm and/or the CuSiN sublayer has a Si portion of at least 20%.

4. The power semiconductor device of claim 1, wherein the coupling layer comprises a CuSi sublayer in contact with the base layer.

5. The power semiconductor device of claim 1, wherein the first side adjoins an encapsulation.

6. The power semiconductor device of claim 5, wherein the encapsulation covers the first load terminal, and wherein at least one transition between the first load terminal and the encapsulation includes a layer stack comprising each of a portion of the base layer, a portion of the coupling layer, and a portion of the ALD layer.

7. The power semiconductor device of claim 1, wherein the ALD layer comprises a metal oxide.

8. The power semiconductor device of claim 1, wherein the ALD layer has a thickness within a range of 2 nm to 20 nm.

9. The power semiconductor device of claim 1, wherein the coupling layer has a thickness within a range of 1 nm to 15 nm.

10. The power semiconductor device of claim 1, wherein the base layer consists of a material having a copper portion of a least 80%.

11. The power semiconductor device of claim 1, wherein the base layer has a thickness of at least 2 μm.

12. The power semiconductor device of claim 1, wherein the base layer adjoins the semiconductor body based on at least one of an insulation layer and a contact plug.

13. A power semiconductor device, comprising:
    a semiconductor body;
    a first load terminal at the semiconductor body; and
    a second load terminal at the semiconductor body,
    wherein the power semiconductor device is configured to conduct a load current between the first load terminal and the second load terminal;
    wherein the first load terminal has a first side and a second side adjoining the semiconductor body,
    wherein the first load terminal comprises:
        at the first side, an atomic layer deposition (ALD) layer;
        at the second side, a base layer comprising copper; and
        between the ALD layer and the base layer, a coupling layer that comprises copper-germanium-nitride (Cu-GeN).

14. The power semiconductor device of claim 13, wherein the coupling layer has a CuGeN sublayer in contact with the ALD layer.

15. The power semiconductor device of claim 14, wherein the CuGeN sublayer has a thickness within a range of 1 nm to 5 nm and/or the CuGeN sublayer has a Ge portion of at least 20%.

16. The power semiconductor device of claim 13, wherein the coupling layer has a CuGe sublayer in contact with the base layer.

17. The power semiconductor device of claim 13, wherein the first side adjoins an encapsulation.

18. The power semiconductor device of claim 17, wherein the encapsulation covers the first load terminal, and wherein at least one transition between the first load terminal and the encapsulation includes a layer stack comprising each of a portion of the base layer, a portion of the coupling layer, and a portion of the ALD layer.

19. The power semiconductor device of claim 13, wherein the ALD layer comprises a metal oxide.

20. The power semiconductor device of claim 13, wherein the ALD layer has a thickness within a range of 2 nm to 20 nm.

21. The power semiconductor device of claim 13, wherein the coupling layer has a thickness within a range of 1 nm to 15 nm.

22. The power semiconductor device of claim 13, wherein the base layer consists of a material having a copper portion of a least 80%.

23. The power semiconductor device of claim 13, wherein the base layer has a thickness of at least 2 μm.

24. The power semiconductor device of claim 13, wherein the base layer adjoins the semiconductor body based on at least one of an insulation layer and a contact plug.

25. A method of producing a power semiconductor device, the method comprising:
    forming a semiconductor body;
    forming a first load terminal at the semiconductor body; and
    forming a second load terminal at the semiconductor body,
    wherein the power semiconductor device is configured to conduct a load current between the first load terminal and the second load terminal,
    wherein the first load terminal has a first side and a second side adjoining the semiconductor body,
    wherein the first load terminal comprises:

at the first side, an atomic layer deposition (ALD) layer;
at the second side, a base layer comprising copper; and
between the ALD layer and the base layer, a coupling layer that comprises copper-silicon-nitride (CuSiN).

26. The method of claim 25, wherein forming the base layer comprises at least one of an electro-plating processing step and a deposition processing step.

27. The method of claim 25, wherein forming the coupling layer comprises depositing silicon (Si) or germanium (Ge) onto a surface of the base layer.

28. The method of claim 27, wherein forming the coupling layer further comprises an ammonia (NH3) plasma treatment processing step.

29. A method of producing a power semiconductor device, the method comprising:
forming a semiconductor body;
forming a first load terminal at the semiconductor body; and
forming a second load terminal at the semiconductor body,
wherein the power semiconductor device is configured to conduct a load current between the first load terminal and the second load terminal,
wherein the first load terminal has a first side and a second side adjoining the semiconductor body,
wherein the first load terminal comprises:
at the first side, an atomic layer deposition (ALD) layer;
at the second side, a base layer comprising copper; and
between the ALD layer and the base layer, a coupling layer that comprises copper-germanium-nitride (Cu-GeN).

30. The method of claim 29, wherein forming the base layer comprises at least one of an electro-plating processing step and a deposition processing step.

31. The method of claim 29, wherein forming the coupling layer comprises depositing silicon (Si) or germanium (Ge) onto a surface of the base layer.

32. The method of claim 31, wherein forming the coupling layer further comprises an ammonia (NH3) plasma treatment processing step.

33. A power semiconductor device, comprising:
a semiconductor body;
a first load terminal at the semiconductor body and;
a second load terminal at the semiconductor body,
wherein the power semiconductor device is configured to conduct a load current between the first load terminal and the second load terminal;
wherein the first load terminal has a first side and a second side adjoining the semiconductor body,
wherein the first load terminal comprises:
at the first side, a layer;
at the second side, a base layer comprising copper; and
between the layer and the base layer, a coupling layer that comprises copper-silicon-nitride (CuSiN).

34. The power semiconductor device claim 33, wherein the layer comprises a metal oxide.

35. A power semiconductor device, comprising:
a semiconductor body;
a first load terminal at the semiconductor body; and
a second load terminal at the semiconductor body,
wherein the power semiconductor device is configured to conduct a load current between the first load terminal and the second load terminal;
wherein the first load terminal has a first side and a second side adjoining the semiconductor body,
wherein the first load terminal comprises:
at the first side, a layer;
at the second side, a base layer comprising copper; and
between the layer and the base layer, a coupling layer that comprises copper-germanium-nitride (CuGeN).

36. The power semiconductor device claim 35, wherein the layer comprises a metal oxide.

* * * * *